March 25, 1969 D. E. AITCHISON 3,435,193

ANALOG-DIGITAL HYBRID DIVIDER APPARATUS

Filed Oct. 14, 1965

INVENTOR.
DON E. AITCHISON
BY Bruce C Lutz
ATTORNEY

United States Patent Office 3,435,193
Patented Mar. 25, 1969

3,435,193

ANALOG-DIGITAL HYBRID DIVIDER APPARATUS

Don E. Aitchison, Duarte, Calif., assignor to Honeywell Inc., Minneapolis, Minn., a corporation of Delaware Filed Oct. 14, 1965, Ser. No. 495,952
Int. Cl. G06j *1/02;* H03k *4/10, 3/45*
U.S. Cl. 235—150.52 4 Claims

ABSTRACT OF THE DISCLOSURE

A hybrid divider which divides one analog signal by a second analog signal to provide a digital output. The divisor signal is converted to a staircase type of waveform wherein each step is indicative of a predetermined fraction of the divisor. The staircase waveform is compared to the dividend, and when the magnitude of the staircase waveform equals or exceeds the magnitude representing the dividend, the division process is complete. Each time the staircase waveform is incremented, the count in a counter is increased by one and at the end of the division process the total count in the counter represents the quotient.

This invention generally relates to computing apparatus and more specifically to a divider which can divide one analog signal by another to provide a digital quotient.

In the past it has often been necessary to preform arithmetic computations on analog input signals when a digital output signal was desired. Generally, two main alternatives were available. The analog input signal could be converted by an analog-to-digital converter and the necessary arithmetic computation could be performed by digital circuits. The second alternative was to perform the arithmetic computations on analog signals and digitize the resultant output signal. These alternatives required one or two analog-to-digital converters and other circuitry to perform the arithmetic computation.

This invention is specifically a divider circuit adapted to receive two analog input signals and to provide a digital output signal indicative of one analog signal divided by the other. This invention overcomes the need for separate analog-to-digital converters by combining the conversion and division in one step thereby eliminating the necessity of analog-to-digital converters.

In this invention the divisor signal is converted to a staircase type of waveform wherein each step of the staircase is indicative of a predetermined fraction of the divisor. The staircase waveform is compared to the dividend, and when the magnitude of the staircase waveform equals or exceeds the magnitude representing the dividend, the division process is complete. Each time the staircase waveform is incremented, the count in a counter is increased by one and at the end of the division process the total count in the counter represents the quotient.

Accordingly, it is an object of this invention to provide a divider circuit capable of accepting an analog divisor and dividend and providing a digital quotient without the use of analog-to-digital converters.

Other objects and advantages of this invention will become evident to those skilled in the art upon a reading of this specification and accompanying claims in conjunction with the drawings, wherein:

Figure 1:
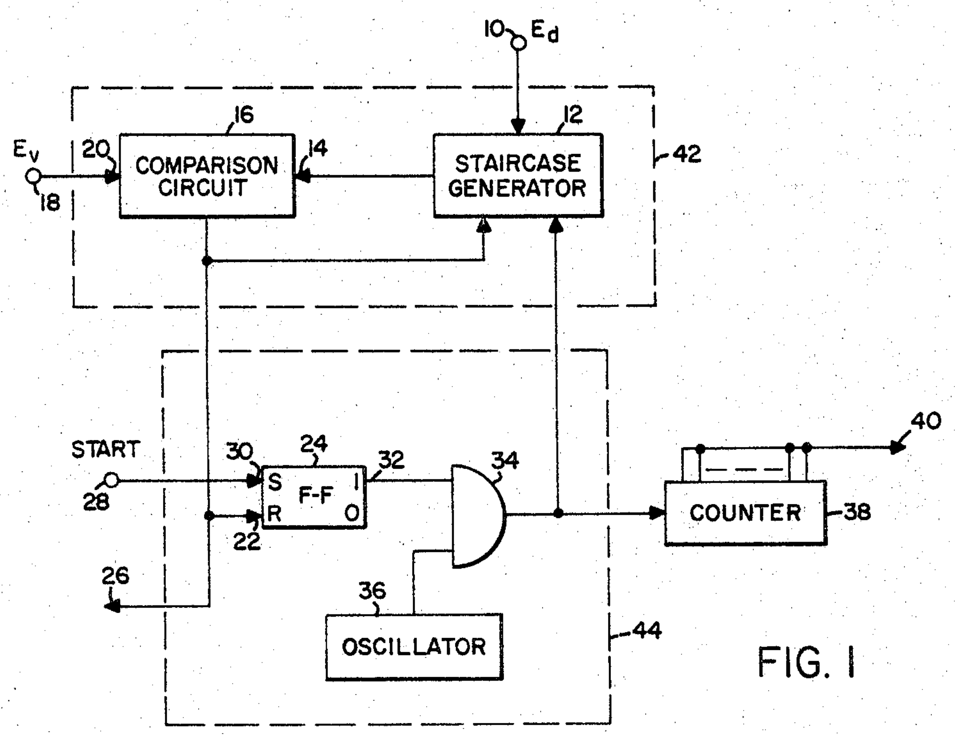
FIGURE 1 is a block diagram of one embodiment of this invention.

Referring now to FIGURE 1, there is shown an input means or terminal 10 to which a signal is applied representing a divisor, $E_d$. Input terminal 10 is connected to one input of a waveform generator or staircase generator

12 the output of which is connected to an input 14 of a comparison means or circuit 16. A second input means or terminal 18 is connected to an input 20 of comparison circuit 16. A signal indicative of a dividend, $E_v$, is applied to terminal 18.

Comparison circuit 16 provides an output signal which is coupled to a second input of staircase generator 12, to a reset input 22 of a bistable means, bistable element or flip-flop 24, and to an output means or terminal 26. An input means or terminal 28 is connected to a set input 30 of flip-flop 24, the one or set output 32 of which is connected to one input of a gate means or AND gate 34. An output of an oscillator means or clock means 36 is connected to a second input of AND gate 34, The output of AND gate 34 is connected to a third input of staircase generator 12 and to an input of a counting means or counter 38. Counter 38 has a plurality of outputs connected to an output terminal 40. Output terminal 40 may have a connection for each of the stages of counter 38 so that the signal from counter 38 can be read out in parallel. However, the signal in counter 38 could be read out serially, for example, by shifting the bits out one end of counter 38.

Staircase generator 12 and comparison circuit 16 may be considered a comparator means (shown enclosed by a dashed line) 42. Flip-flop 24, AND gate 34, and oscillator 36 may be considered a pulse producing or supplying means (shown enclosed by a dashed line) 44.

The detailed design of the comparison circuit is not important to this invention, however, a circuit such as that shown in Electronic Equipment Engineering, March 1961, pp. 50 and 52 could be used. However, other designs could also be used to provide the comparison function.

Figure 2:
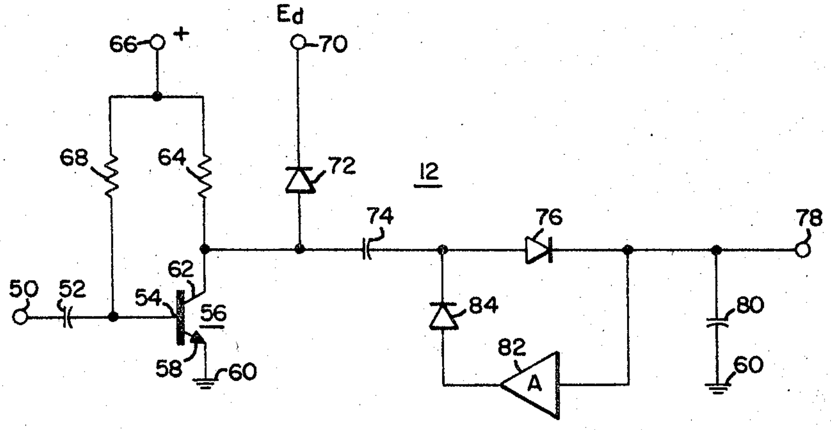
FIGURE 2 is a schematic diagram of a waveform generator circuit.

The staircase generator 12 may be of a type shown in FIGURE 2. Referring now to FIGURE 2, there is shown an input means or terminal 50 which is adapted to be connected to receive input pulses such as those provided by AND gate 34. Input terminal 50 is connected through a capacitor 52 to a base 54 of an NPN transistor 56. An emitter 58 of transistor 56 is connected to a common conductor or ground 60 and a collector 62 is connected through a resistor 64 to a source of positive potential 66. Base 54 is connected through a resistor 68 to the positive source 66.

An input terminal 70 is connected through a reverse poled diode 72 to the collector 62 of transistor 56. Terminal 70 corresponds to terminal 10 of FIGURE 1. Collector 62 of transistor 56 is further connected through a capacitor 74 in series with a diode 76 to an output terminal 78. Output terminal 78 is adapted to be connected to input terminal 14 of comparison circuit 16.

Output terminal 78 is connected through a capacitor 80 to ground 60 and is further connected through a unit gain amplifier 82 in series with a diode 84 to the junction between capacitor 74 and diode 76. The output of comparison circuit 16 would typically be connected to a device such as a switch to discharge capacitor 80.

To understand the operation of FIGURE 1, assume that analog signal voltages are applied at terminals 10 and 18. A pulse applied at terminal 28 is transmitted to the set input 30 of flip-flop 24. When flip-flop 24 is set, the output signal at output 32 energizes or enables gate 34 so that pulses from oscillator 36 are passed through gate 34 to the input of staircase generator 12 and counter 38. At the end of the first pulse from gate 34, the output of the staircase generator 12 is a voltage indicative of $1\times E_d$, where $E_d$ is the divisor. Each successive pulse advances the waveform of staircase generator 12 one step. After $m$ pulses the signal applied at terminal 14 of comparison circuit 16 is indicative of $m\times E_d$. Assuming that $m\times E_d$ just equals or exceeds the voltage applied at input terminal 20, which is $E_v$ or the dividend, comparison circuit 16 provides an output signal indicating that the division process is complete. This output signal resets flip-flop 24 by pulsing the reset input 22, resets staircase generator 12, and provides a "quotient available" signal at output terminal 26.

As each pulse from gate 34 advances staircase generator 12, the same pulse is counted by counter 38, The number or count in counter 38 at the end of the division process is an integer or digital representation of the quotient $E_v/E_d$.

To understand the operation of FIGURE 2, assume that no signal is present at input terminal 50. Transistor 56 will be ON because base 54 is connected to terminal 66. Diode 72 will be reverse biased because its anode is connected through transistor 56 to ground 60. Capacitor 74 will be charged by amplifier 82 to a voltage proportional to the voltage across capacitor 80. When a pulse occurs at input terminal 50, transistor 56 will be switched OFF. If the voltage of positive source 66 is greater than $E_d$, diode 72 will be forward biased and the collector 62 of transistor 56 will be clamped to the voltage $E_d$. Current will flow through capacitor 74, diode 76, and capacitor 80 to ground 60. The current flowing through capacitor 80 will provide an increment of voltage $\Delta e$ across capacitor 80 which provides another step on the staircase waveform. After each pulse is applied to terminal 50, transistor 56 switches ON so that capacitor 74 can be recharged by amplifier 82. The increment of voltage $\Delta e$ is determined by the following equation $$\Delta e=\frac{C1}{C1+C2}(E_d-e_{C1}-e_{C2}) \quad (1)$$

where C1 represents the capacitance of capacitor 74, C2 represents the capacitance of capacitor 80, $e_{C1}$ represents the voltage across capacitor 74, and $e_{C2}$ represents the voltage across capacitor 80. However, after each cycle of operation, amplifier 82 charges capacitor 74 to $-e_{C2}$ so that in Equation 1 $e_{C1}=-e_{C2}$. Then $$\Delta e=\frac{C1}{C1+C2}E_d \quad (2)$$

and after *m* pulses, $$e_{C2}=m\frac{C1}{C1+C2}E_d \quad (3)$$

As FIGURE 2 provides an output signal at terminal 78 which is a scaled version of the divisor $E_d$, $E_v$ may also be scaled by the same factor. This scale factor is $C1/C1+C2$. Staircase generator 12 is designed to be reset by an output signal from comparison circuit 16. This reset provision may be a switch (not shown) connected across capacitor 80 to discharge capacitor 80 when the switch is closed or activated by the output signal from comparison circuit.

It will be realized by those skilled in the art that this invention is particularly adapted to performing a division where $E_d$ is much smaller than $E_v$. However, those skilled in the art will also realize that by further scaling of $E_d$ and $E_v$, any relationship may be obtained. If $E_v$ and $E_d$ are scaled by different factors, the quotient provided at output terminal 40 of FIGURE 1 must also be considered as having a scale factor associated with it. Normally, the analog signals $E_v$ and $E_d$ may be scaled by a simple resistor divider network or potentiometer.

It is to be understood that while I have shown one embodiment of my invention, those skilled in the art will realize that many modifications may be made within the scope of my invention. Accordingly, I intend to be limited only by the scope of the appended claims.

I claim as my invention:

1. Divider apparatus comprising, in combination.
means for supplying a first analog input signal;
means for supplying a second analog input signal;
oscillator means for supplying a train of pulses;
gate means connected to said oscillator means for receiving said train of pulses and for transmitting said train of pulses when said gate means is enabled;
staircase waveform generating means connected to said gate means for receiving said train of pulses from said gate means and further connected to said means for supplying a first analog signal for providing an output signal which is a fraction of said first analog input signal which fraction is unidirectionally increased by a predetermined amount by each pulse of said train of pulses;
comparison means connected to said staircase waveform generating means and to said means for supplying a second analog signal for providing an output signal when said output signal from said staircase waveform generating means is substantially equal to said second analog input signal;
means connecting said comparison means to said gate means for inhibiting said gate means when said comparison means provides said output signal; and
counter means connected to said gate means for counting the pulses transmitted by said gate means and for providing an output indication of the total number of the pulses so counted.

2. Divider apparatus comprising, in combination:
first and second input means for providing first and second input signals, respectively;
pulse generating means for supplying a pulse train;
staircase waveform generating means connected to said first input means and to said pulse generating means for providing a signal of a generally staircase waveform with each step in the waveform being a fraction of said first input signal and each step unidirectionally increasing the waveform upon the occurrence of each pulse in said pulse train;
comparison means connected to said staircase generating means and to said second input means for providing an output signal when the signal from said staircase waveform generating means and said second input signal are of a predetermined relationship;
means connecting said comparison means to said pulse generating means for inhibiting said pulse generating means upon the occurrence of said output signal from said comparison means; and
counter means for totaling the number of incrementing pulses which increase the signal from said staircase waveform generating means.

3. Divider apparatus as defined in claim 2 wherein said pulse generating means includes oscillator means for providing pulses, gate means connected to said oscillator means for receiving pulses therefrom, and further connected to said staircase waveform generating means and to said counter means for providing pulses thereto when an enabling signal is received, and bistable means connected to said gate means and to said comparison means for receiving the output signal from said comparison means and for providing enabling and inhibiting signals to said gate means.

4. Divider apparatus as defined in claim 2 wherein said comparison means provides the output signal therefrom when the predetermined relationship is that the signal from said staircase generating means and said second input signal are substantially equal.

References Cited

UNITED STATES PATENTS

| | | | |
|---|---|---|---|
| 2,871,378 | 1/1959 | Lohman | 307—227 XR |
| 3,150,271 | 9/1964 | Robertson | 328—186 XR |
| 3,194,950 | 7/1965 | Walls et al. | 235—154 |
| 3,337,862 | 8/1967 | Croft et al. | 307—227 XR |

MARTIN P. HARTMAN, *Primary Examiner.*

U.S. Cl. X.R.

307—227; 328—182